United States Patent [19]

Moss et al.

[11] 4,436,769
[45] Mar. 13, 1984

[54] IMPROVED METAL ORGANIC VAPOR DEPOSITION PROCEDURE FOR PREPARING GROUP III—V COMPOUNDS ON A HEATED SUBSTRATE

[75] Inventors: Rodney H. Moss, Felixstowe; Marc M. Faktor, Bushey Heath, both of England

[73] Assignee: British Telecommunications, London, England

[21] Appl. No.: 322,438

[22] Filed: Nov. 18, 1981

[30] Foreign Application Priority Data

Nov. 18, 1980 [GB] United Kingdom ............... 8036902
Feb. 17, 1981 [GB] United Kingdom ............... 8104953

[51] Int. Cl.$^3$ .................... C23C 11/00; C23C 13/00
[52] U.S. Cl. ............................. 427/252; 427/255.2; 427/314
[58] Field of Search ............ 427/255.2, 252, 314, 427/421, 255.6, 427; 148/174, 175

[56] References Cited

U.S. PATENT DOCUMENTS

| | | | |
|---|---|---|---|
| 3,101,280 | 8/1963 | Harrison | 427/255.2 |
| 3,556,875 | 1/1971 | Holloway et al. | 427/255.2 |
| 3,635,771 | 1/1972 | Shaw | 427/255.2 |
| 3,663,320 | 5/1972 | Maruyama et al. | 427/255.2 |
| 3,664,866 | 5/1972 | Manasevit | 427/255.2 |
| 3,690,915 | 9/1972 | Davey et al. | 427/255.2 |
| 3,843,398 | 10/1974 | Maagdenberg | 427/94 |
| 3,867,202 | 2/1975 | Ichiki et al. | 148/175 |

FOREIGN PATENT DOCUMENTS

| | | | |
|---|---|---|---|
| 1593905 | 3/1978 | United Kingdom | 148/175 |
| 2007632 | 5/1979 | United Kingdom | 427/88 |

OTHER PUBLICATIONS

Electronics Letters, "InP Epitaxy with a New Metalorganic Compound", Renz et al., p. 228, vol. 16, No. 6, Mar. 13, 1980.

Electronic Materials Conference, Cornell University, Paper H-2, Jun. 1980.
Benz et al., "The Use of a Metalorganic Compound for the Growth of InP-Epitaxial Layers", J. of Electronic Materials, vol. 10, No. 1, pp. 185-193, 1981.
Bass, "Device Quality Epitaxial Gallium Arsenide Grown by The Metal Alkyl-Hydride Technique", J. of Crystal Growth, pp. 172-178, 1975.
Duchemin et al., "Organometallic Growth of Device-Quality InP by Cracking of In($C_2H_5$)$_3$ & $PH_3$ at Low Pressure", The Institute of Physics, pp. 10-18, 1979.
Zaouk et al., J. of Crystal Growth, vol. 46, No. 3, pp. 415-420, Mar. 1979.
Electric Phenomena, vol. 88, p. 583, 82760b, 1978.

*Primary Examiner*—Sadie L. Childs
*Attorney, Agent, or Firm*—Kemon & Estabrook

[57] ABSTRACT

A method of depositing a group III element—group V element compound or alloy on a hot substrate using a metal organic chemical vapor deposition procedure. Attempts to apply an MOCVD procedure to the production of a group III element—group V element compound from alkyl derivatives of group III elements which are strong Lewis acids and group V element hydrides have met with limited success. This is because the reactants react in the cold gas phase to form an involatile polymer which does not give the required product on the hot substrate. The present invention proposes modifying the alkyl derivative of the group III element to be a weaker Lewis acid. This can be achieved by either substituting an electron donating group for one of the alkyl groups bonded to the group III element or by combining the group III element alkyl derivative with an alkyl derivative of a group V element thereby forming a volatile compound. Both the substituted alkyl derivative of the group III element and the volatile alkylated group III-V compound give the required product when used in admixture with a group V element hydride in an MOCVD process.

10 Claims, 1 Drawing Figure

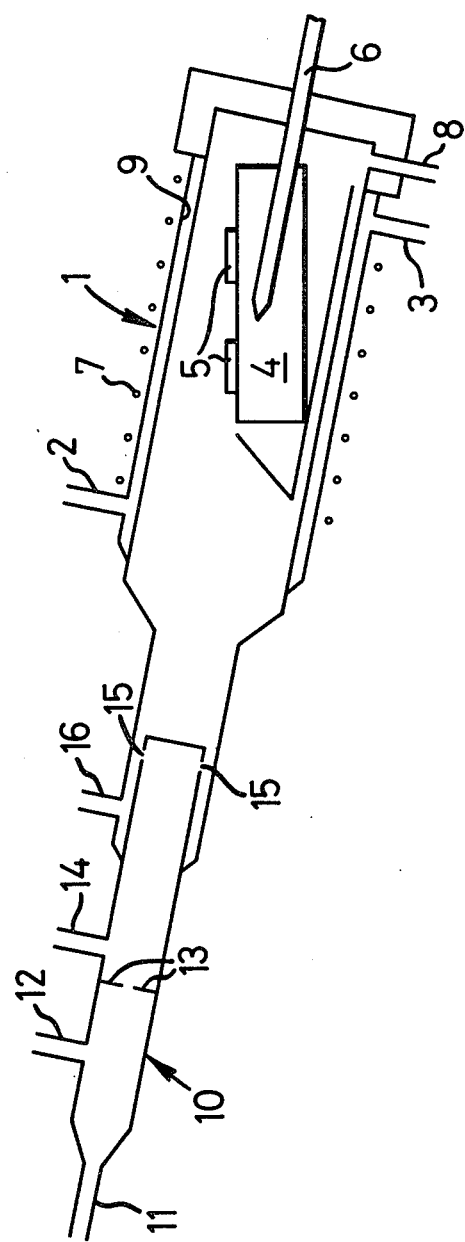

METAL ORGANIC VAPOR DEPOSITION PROCEDURE FOR PREPARING GROUP III—V COMPOUNDS ON A HEATED SUBSTRATE

DESCRIPTION

This invention relates to the manufacture of group III-V alloys or compounds, hereinafter referred to as compounds. More specifically, the invention relates to the deposition onto a heated substrate in an otherwise cool environment of the precursors of the compounds to be produced.

The Metal Organic Chemical Vapour Deposition procedure referred to hereinafter as MOCVD has been proposed. This procedure comprises impinging a stream of cool gaseous reactants usually in admixture with a carrier gas onto a hot substrate and is exemplified by the reaction of trimethyl gallium and arsine with hydrogen as a carrier gas. This reaction can be represented by the equation.

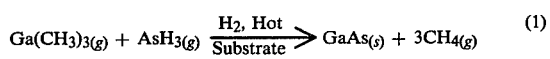

Attempts to apply an analogous reaction to the production of group III-V compounds wherein the group III element is indium, for example indium phosphide, have met with limited success as trialkylindium and group V element hydrides, for example phosphine and arsine, react together in the cold to form an involatile polymeric substance before reaching the hot substrate. The formation of the polymer may be summarised in the following equation:

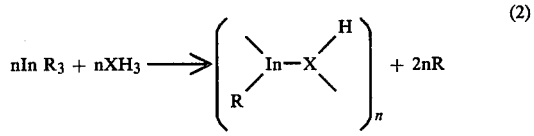

where R=alkyl, and X is a group V element. A reaction of this type was disclosed by R. Didchenko et al. in J. In. Org. Nuc. Chem. 1960 Vol. 14 p. 35. Formation of this polymeric substance causes depletion of the gas phase reactants resulting in poor product growth rates and morphology. Furthermore accurate control of the amount of indium present in the product is impossible as the gas phase concentration of the indium compound is being varied by reaction 2 as shown above. Trimethyl gallium and arsine do not produce a corresponding polymeric substance to any significant extent.

In accordance with the present invention, instead of attempting to react the group V element hydride with an alkyl derivative of a group III element on impact with the hot substrate, electron density is donated to the alkyl derivative of the group III element thereby rendering the derivative a weaker Lewis acid which does not undergo the reaction with the group V hydride to form an involatile polymer. Thereafter this modified derivative, in admixture with the hydride of the required group V element, is conveyed to a substrate on a heated susceptor plate where the required group III— group V compound is deposited. A Lewis acid is herein defined as an element or compound which is electron deficient and an electron acceptor, and a Lewis base is an element or compound which has an "excess" of electrons and is an electron donor.

A first method in accordance with the present invention comprises reacting (1) an alkyl derivative of the desired group III element with, (2) an alkyl derivative of a group V element thereby forming a volatile intermediate, and thereafter conveying the volatile intermediate and (3) the hydride of the desired group V element as gases in a stream of hydrogen gas to impinge upon a hot substrate. In this method electron density is donated to the alkyl derivative of the group III element in the reaction between it and the alkyl derivative of a group V element forming the volatile intermediate. This volatile intermediate reacts with the group V element hydride on the hot substrate. The reaction can be represented by the equation:

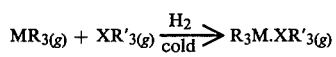

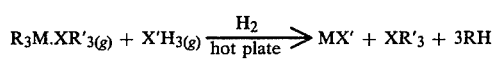

where M is a group III element, X and X' are group V elements and R and R' are alkyl groups. X may be the same as X', but it need not be and R may be the same as R' but it need not be. R and R' are preferably methyl or ethyl groups.

In the above equation $MR_3$ reacts with $XR'_3$ when cold and the compound formed, $R_3M.XR'_3$ is stable in the presence of $X'H_3$ because $XR'_3$ is a stronger Lewise base than $X'H_3$, thus the formation of the unwanted polymer is stopped.

A second method in accordance with the present invention comprises replacing an alkyl group on the alkyl derivative of the desired group III element with an electron donating group and thereafter conveying the resulting substituted alkyl derivative of the group III element to a hot substrate in admixture with the hydride of the required group V element in a stream of hydrogen gas.

In this method a substituted alkyl derivative of a group III element is prepared which is a weaker Lewis acid than the non-substituted alkyl derivative of the group III element. When used in the MOCVD procedure this substituted alkyl derivative of a group III element will not react with the group III element hydride until it reaches the hot substrate.

The invention will now be described with reference to the following Examples and the accompanying drawing which is a schematic view of an apparatus for carrying the method of the invention into effect. The general procedure for carrying the invention into effect will initially be described with reference to the drawing.

The apparatus illustrated comprises a water cooled vessel 1 with inlet and exit pipes 2 and 3 for cooling water running through exterior cooling jacket 9. The interior of the vessel 1 houses a graphite pedestal 4 onto which substrates 5 for the vapour deposition are laid. A thermocouple 6 extending from outside the vessel 1 penetrates the interior of the pedestal 4 and the outside of the vessel is surrounded by an induction heating coil 7. The interior of the vessel has a waste exhaust pipe 8. Thus far the invention is a standard reaction vessel for MOCVD with the exception that the water jacket 9 is shortened and does not cover the vapour entry end part of the vessel 1. The reasons for this will become apparent.

At the inlet end of the vessel 1 there is an entry passage 10 for vapour streams for reaction, in accordance with the invention, into an adduct or a compound. Passage 10 has an axial entry port 11 for the group III alkyl derivative vapour and a radial port 12 adjacent port 11 for entry of the electron donating vapour. Baffles 13 restrict the passage in front of radial port 12 in order to define a partially closed reaction chamber. Immediately in front of baffles 13 there is a radial entry port 14 for dopants such as H$_2$S and ZnMe$_2$. The passage extends into the vessel 1 and has side orifices 15 for communicating the passage 10 with the vessel interior. A radial entry port 16 is provided in the vessel outside of water jacket 9 for the group V hydride vapour.

Means such as a heater tape are provided for raising the temperature of the entry passage 10 typically to 20° above ambient, in order to prevent condensation of the adduct or compound produced in the passage 10. Premature condensation is also discouraged by the shortening of the water jacket referred to previously.

Referring now to the specific examples.

EXAMPLE 1

A first cool vapour stream comprising $10^{-4}$ mol fraction of trimethyl indium in hydrogen is caused to flow into passage 10 through port 11 and a second cool vapour stream comprising a similar concentration of triethyl phosphine in hydrogen is caused to flow into passage 10 through port 12. The streams reacted within the reaction chamber to provide a volatile adduct which enters the vessel 1 through ports 15 to be contacted by a third cool vapour stream of approximately 15 times the quantity of phosphine again in admixture with hydrogen entering the vessel through port 16. The mixed vapour streams impinge upon the heated, typically 650°±50° C. substrate 5 to deposit indium phosphide. The reactions can be represented as follows:

$$InMe_3 + PEt_3 \xrightarrow[cold]{H_2 (g)} Me_3In.PEt_3$$

$$Me_3In.PEt_3 + PH_3 \xrightarrow[hot\ substrate]{H_2 (g)} InP + PEt_3 + 3MeH$$

The deposition rate is adjusted to approximately 5 to 6 microns per hour per unit area by adjustment of the vapour inlet flows using mass flow controllers.

In the following further examples the reaction apparatus and conditions are similar to those set out above.

EXAMPLE 2

Indium arsenide was prepared on a hot substrate by a MOCVD process wherein trimethyl indium and triethyl arsine followed by an excess quantity of arsine were combined in a cool stream of hydrogen gas and impinged upon the substrate. The reaction can be represented by the following equation:

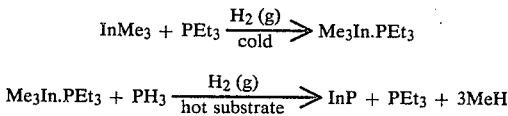

$$Me_3In.AsEt_3 + AsH_3 \xrightarrow[hot\ substrate]{H_2} InAs + AsEt_3 + 3MeH$$

EXAMPLE 3

Indium phosphide was prepared on a hot substrate by an MOCVD process wherein triethyl indium and, triethylamine followed by an excess quantity of phosphine were combined in a cool stream of hydrogen gas and impined upon the substrate. The reaction can be represented by the following equation:

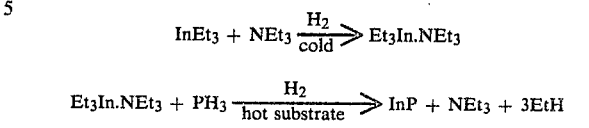

$$Et_3In.NEt_3 + PH_3 \xrightarrow[hot\ substrate]{H_2} InP + NEt_3 + 3EtH$$

EXAMPLE 4

Gallium indium arsenide a tertiary alloy was prepared on a hot substrate by an MOCVD process wherein trimethyl gallium, trimethyl indium and triethyl phosphine followed by an excess quantity of arsine were combined in a cool stream of hydrogen gas and impinged upon the substrate. The reaction can be represented by the following equation:

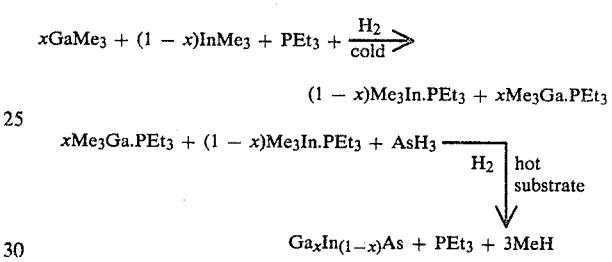

The second method in accordance with the present invention is illustrated by the following example:

EXAMPLE 5

Indium phosphide was prepared on a hot substrate by an MOCVD process wherein phosphine and dimethyl diethylamino Indium (ME$_2$InNEt$_2$) were combined in a cool stream of hydrogen gas and impinged upon a hot substrate. The dimethyl diethylamino indium was prepared by conventional chemical means. It will be appreciated that dimethyl diethylamino indium is trimethyl indium with one of the alkyl groups replaced by the electron donating amine group. Thus dimethyl diethylamino indium is a weaker Lewis acid than trimethyl indium. The MOCVD reaction can be represented by the following equation:

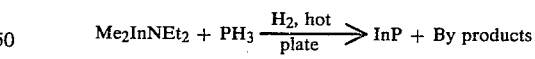

The dimethyl diethylamino indium does not react with PH$_3$ when cold to yield an involatile product. Dimethyl dimethylamino indium may be used and is preferable by reason of its enhanced volatility.

EXAMPLE 6

Gallium indium arsenide phosphide a quaternary alloy was prepared on a hot substrate by an MOCVD process wherein trimethyl gallium, trimethyl indium, triethyl phosphine and an excess quantity of arsine and phosphine were the cold gases impinged upon the substrate. The reaction can be represented by the following equation:

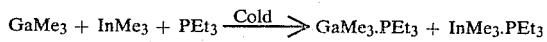

-continued

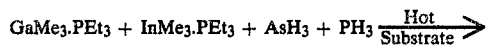

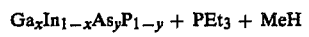

In this reaction the equations are not balanced, but for accuracy the x and y terms for the alloy are included.

The invention is, in principle, applicable to any system involving an alkyl derivative which is so strong a Lewis acid as to render it difficult to convey it to a desired reaction location.

We claim:

1. In a method of forming a group III-group V compound on a heated substrate by causing vapor streams carrying respectively a group III alkyl derivative and a group V hydride to mix and impinge on the substrate, whereby the group III alkyl derivative and the group V hydride react to form the group III-group V compound, the improvement which comprises: modifying the group III alkyl derivative by the donation thereto of electron density to form a weaker Lewis acid; mixing the resulting modified group III alkyl derivative with the group V hydride; and impinging the mixture on the substrate.

2. The improved method of claim 1, wherein the modification of the group III alkyl derivative is accomplished by combining the alkyl derivative of the desired group III element with an alkyl derivative of a group V element, which is a Lewis Base, thereby forming a volatile adduct.

3. The improved method of claim 1, wherein the modification of the group III alkyl derivative is accomplished by replacing an alkyl group with an electron donating group.

4. The improved method of claim 1, wherein the modified derivative is prepared immediately before conveying it to the substrate.

5. The improved method of claim 3, wherein the modified derivative is prepared and isolated prior to the reaction with the group V hydride and deposition on the substrate.

6. The improved method of claim 1, wherein the group III element is indium.

7. The improved method of claim 1, wherein the vapor stream containing the group III alkyl derivative is maintained at a temperature above ambient to avoid condensing of the modified derivative.

8. The improved method of claim 1, wherein the vapor streams contain an excess of hydrogen.

9. The improved method of claim 1, wherein a mixture of group III alkyl derivatives is modified prior to conveying to the substrate.

10. The improved method of claim 1, wherein a mixture of group V hydrides is conveyed to the substrate.

* * * * *